(12) United States Patent
Amatangelo et al.

(10) Patent No.: US 6,650,592 B2
(45) Date of Patent: Nov. 18, 2003

(54) DATA PROCESSING SYSTEM, METHOD, AND PRODUCT FOR AUTOMATICALLY PERFORMING TIMING CHECKS ON A MEMORY CELL USING A STATIC TIMING TOOL

(75) Inventors: Matthew J. Amatangelo, Austin, TX (US); Christopher M. Durham, Round Rock, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/998,044

(22) Filed: Nov. 29, 2001

(65) Prior Publication Data

US 2003/0099129 A1 May 29, 2003

(51) Int. Cl.[7] .................................................. G11C 8/00
(52) U.S. Cl. ........................................ 365/233; 365/203
(58) Field of Search .............................. 365/154, 203, 365/191, 233

(56) References Cited

U.S. PATENT DOCUMENTS

| | | | |
|---|---|---|---|
| 5,095,454 A | * 3/1992 | Huang | 703/19 |
| 5,657,239 A | * 8/1997 | Grodstein et al. | 703/19 |
| 5,771,375 A | * 6/1998 | Mains | 713/503 |
| 5,831,900 A | * 11/1998 | Miyamoto | 365/185.03 |
| 6,038,166 A | * 3/2000 | Wong | 365/185.03 |
| 6,351,837 B1 | * 2/2002 | Huang et al. | 714/724 |

* cited by examiner

Primary Examiner—Thong Le
(74) Attorney, Agent, or Firm—Duke W. Yee; Mark E. McBurney; Lisa L. B. Yociss

(57) ABSTRACT

A system, method, and computer program product are disclosed for automatically performing timing checks on a memory cell. A static timing tool is provided that includes multiple, different standard timing elements. Each standard timing element is associated with one or more standard timing checks. The memory cell is represented using one or more of the standard timing elements. Standard timing checks associated with the timing elements used to represent the memory cell are used to verify timing in the memory cell.

27 Claims, 3 Drawing Sheets

DATA PROCESSING SYSTEM, METHOD, AND PRODUCT FOR AUTOMATICALLY PERFORMING TIMING CHECKS ON A MEMORY CELL USING A STATIC TIMING TOOL

BACKGROUND OF THE INVENTION

1. Technical Field

The present invention relates generally to the field of timing tools executing by data processing systems, and more specifically to a system, method, and product for automatically performing timing checks on a memory cell using a static timing tool.

2. Description of Related Art

FIG. 1 is a schematic diagram of a two-bit static RAM circuit in accordance with the prior art. The two input pins at the top of the diagram are labeled din (for data in) and din_b (for data in bar) and represent the true and complement data respectively to be written into the selected memory cell. Signals din and din_b are connected to tri-state buffer/driver TR0 and TR1 respectively. The other input connected to TR0 and TR0 is write enable (wen). Bit line (bl) and its complement bit line bar (bl_b) are the outputs of TR0 and TR1 respectively and present true and complement write data during the write operation. CELL0 and CELL1 are a one bit memory cell each, where block CELL0 contains the same circuitry as the detailed view in CELL1.

CELL1 consists of p-channel devices Q21 and Q23 and n-channel devices Q20, Q22, Q24 and Q25. Where Q21 and Q22 form one inverter and Q23 and Q24 form another inverter. Both inverters are configured in such a way that their outputs are connected to the input of the other inverter, thus forming a latching circuit. Q20 and Q25 are configured as pass transistors and are responsible for passing the data in and out of the memory cell. Word lines wl_0 and wl_1 respectively are outputs of DEC0 and DEC1 (2×2 AND OR circuits) respectively. In the following example the operation of DEC1 is described.

If input wrsel<1> and input wen go high, the SRAM enters the write operation for CELL1. It should be noted that the addressing scheme described here is only used for illustration purposes and implies that a decoder (not shown) guarantees the orthogonality of wrsel<0> and wrsel <1>. Hence only one "row" of cells may be written to with each write access. The "row" of cells is represented here by CELL1. An SRAM, however, may be configured such that a row consists of a byte, a word, or any other practical number of bits. It is further implied that the input signals ren (read enable) and pc (pre-charge) are low and high respectively during the write operation.

Inverter INV then drives ren_b high turning off p-channel transistors Q11 and Q10 disconnection the bit lines bl and bl_b from the sense amplifier S_AMP. As wen goes high the tri-state buffer/drivers turn on and valid true and complement write data is driven onto the bl and bl_b regardless of their previous state. Depending upon the arrival time of wrsel<1>, wl_1 goes active (high) at least one delay time through DEC1 after wen has gone high (active). This turns on n-channel pass transistors Q20 and Q25 and data from bl and bl_b is overwriting the cell data (bl_c and bl_c_b). When wl_1 goes low, the write operation is completed and Q20 and Q25 turn off again.

Prior to reading from the cell a pre-charge operation must be performed. For this function ren and wen must be low such that wl_0 and wl_1 are both low and the memory cells are isolated from the bit lines. Hence tri-state drivers/buffers TR0 and TR1 are in their high impedance state. Pre-charge begins when pc goes low turning on p-channel devices Q12, Q13, Q18, Q9, Q8, Q7 and Q10 and bit lines bl and bl_b and sense amp bit lines bl_s and bl_s_b are pre-charged to Vdd. The purpose of Q13 and Q8 is to ensure that the true and complement bit lines receive equal amount of charges. Inactivating pc (pulling high) terminates the pre-charge operation and the SRAM is in standby mode and ready to be read.

Similar to the write operation reading is performed by making the word line wl_o or wl_1 valid. Again only one "row" may be selected and wen must be low keeping TR0 and TR1 in their high impedance state. Reading CELL1 is accomplished by driving both rdsel<1> and ren high. This activates word line wl_1 and pass devices Q20 and Q25 are turned on. Furthermore ren is connected to inverter INV. The inverted output of INV (ren_b) goes low and turns on Q11 and Q10 switching together bl and bl_s and bl_b and bl_s_b respectively. True and complement data that is stored as bl_c and bl_c_b in CELL1 during writing is now passed through respective pass transistors Q20 and Q25 onto bl and bl_b respectively.

If a logic zero was stored in the cell true stored data bl is low and complement stored data bl_c_b is high and since bl_b has been pre-charged to Vdd it remains at a high level. Since true stored data is low (bl_c), bl starts to be discharged from its pre-charge Vdd level towards ground through Q20 and Q22. Sense amplifier enable signal se is timed such that it goes high when during a read operation bl (bl_s) or bl_b (bl_s_b) has been discharged to a predetermined level (e.g. 20%) below Vdd. Sense amplifier S_AMP consists of p-device Q4 and Q5 and n-devices Q1 through 3, where Q2 through Q5 are configured similar to CELL1 as a cross coupled inverter latch. Q1 is the control transistor for se. Once se is high and Q1 is on, the sense amplifier will switch at its threshold which is typically when bl has fallen to 80% of its pre-charge value and helps to discharge bl_s through Q2 and Q1 and therefore bl through Q11. True and complement bit lines (bl and bl_b) are connected to the system through buffer/drivers BUFF_T and BUFF_C respectively (data and data_b). While it is only discharged through the memory cell the slope is small. As soon as se turns on Q1, the discharge slope becomes significantly faster.

Static timing tools have been developed to verify the timing in large logic circuits efficiently. They enable timing analysis without extensive functional pattern generation. But the tools are not always able to "understand" how certain circuits are supposed to function.

Static timing tools include standard timing elements. Each standard timing element has associated with it one or more standard timing checks. When one of these timing elements is encountered, the associated timing check(s) are performed by the static timing tool. As an example, static timing tools include a pre-charge timing element, a latch timing element, and a gated clock timing element.

Static timing tools have not been used to verify timing in memory cells included in particular static random access memory (SRAM) devices. The standard timing elements have not been used before to verify timing in SRAMs because the standard timing elements are engaged when certain circuit structures are present. The RAM circuit structures do not match those that are standard in the static timing tools. The RAM defies the timing tool's ability to find the RAM structures because in the RAM the pre-charge and latching mechanisms are too complicated for the timing tool to parse. For example, in the RAM (1) the latch is dual rail, and (2) the node bl is bi-directional. For instance, bl_c and bl_c_b are complementary storage nodes for the same cells. The static timing tools assume latches do not have complementary storage cells.

Therefore, a need exists for a system, method, and product for automatically performing timing checks on a memory cell using a static timing tool.

SUMMARY OF THE INVENTION

A system, method, and computer program product are disclosed for automatically performing timing checks on a memory cell. A static timing tool is provided that includes multiple, different standard timing elements. Each standard timing element is associated with one or more standard timing checks. The memory cell is represented using one or more of the standard timing elements. Standard timing checks associated with the timing elements used to represent the memory cell are used to verify timing in the memory cell.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to the figures, like numerals being used for like and corresponding parts of the accompanying figures.

The present invention is a system, method, and product for automatically performing timing checks on a memory cell using a static timing tool. A static timing tool includes standard timing elements it uses when verifying timing of circuits. One or more standard timing checks are associated with each of these standard timing elements. The timing of a memory cell included in an SRAM having dual rail sensing can be automatically verified by a standard static timing tool by representing the memory cell using one or more of the standard timing elements. The standard timing checks associated with the timing element(s) used to represent the memory cell are executed by the static timing tool.

Figure 2:
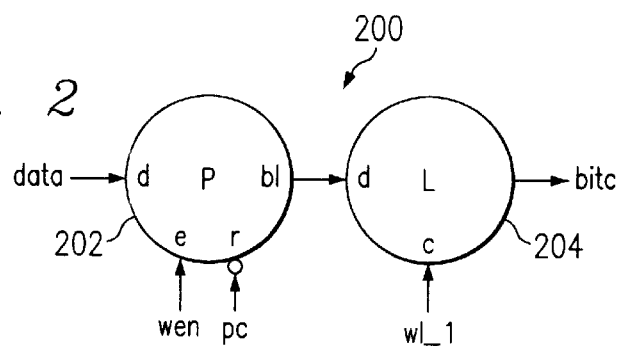
FIG. 2 is a block diagram of a timing representation of a memory cell to use when writing to the memory cell in accordance with the present invention.
Figure 3:
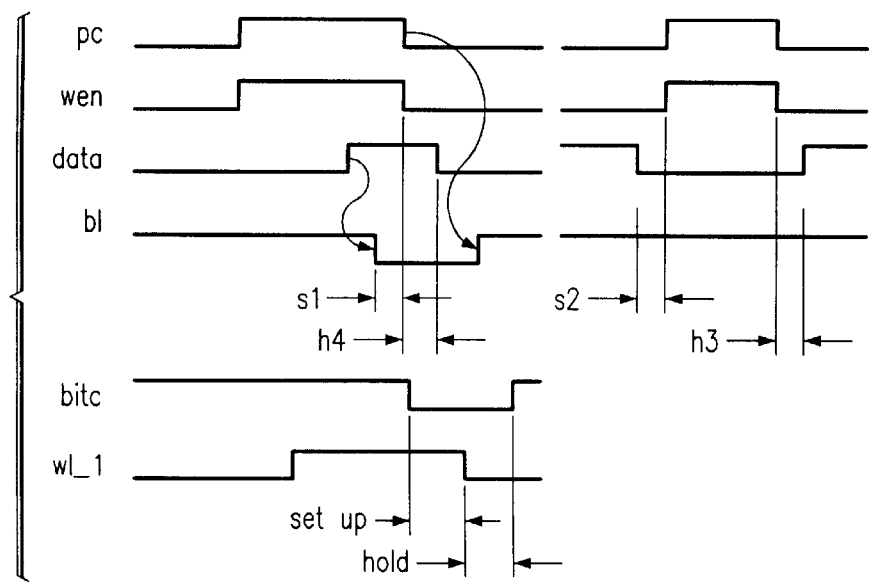
FIG. 3 is a timing diagram depicting timing of multiple signals when writing to a memory cell in accordance with the present invention.

FIG. 2 is a block diagram of a timing representation 200 of a memory cell to use when writing to the memory cell in accordance with the present invention. According to the present invention, a memory cell may be represented to a static timing tool as a pre-charge element 202 coupled to a latch element 204 when the timing during a write operation is to be verified. Standard timing checks, depicted as s1, s2, h3, and h4 in FIG. 3, are used by the static timing tool when the static timing tool encounters a pre-charge element coupled to a latch element. Therefore, because the memory cell is represented as a pre-charge element coupled to a latch element, these standard timing checks are used by the static timing tool to verify timing in the memory cell.

FIG. 3 is a timing diagram depicting timing of multiple signals when writing to a memory cell in accordance with the present invention. Referring to the wave forms of FIG. 3, the key timing situation for writing the SRAM is assuring that bl_c (a node representing a particular RAM cell's storage node, see FIG. 1) is registered against the falling or de-asserting edge of wl_1, the word line of the particular cell. The data of node bl_c is dependent upon node bl, which is dependent upon the later of the two arriving values from nodes wen and din. Therefore, the data is said to be setup in time if the arrival time of valid data on node bl_c occurs prior to the arrival time of the trailing edge of node wl_1 and meets hold time requirements if this valid data is maintained beyond this wl_1 trailing edge event.

To force the static timing tool to perform this write event order checking, bl_c is treated as a latch node. A latch node is a data signal that has a clock and data signal as inputs. The clock signal is provided via the wl_1 signal, the registering event. The immediate data signal input must then be node bl which is pre-charged high by another clock signal, node pc (bit is pre-charged to a logic level one through device Q12 when pc falls to a logic level 0). Referring again to the schematic in FIG. 1, notice that nodes bl_c and bl have complements which are nodes bl_c_b and bl_b respectively. This relationship is used in pre-charge data signal bl falling while registering a logic level 1 comes from bl_b falling.

A constraint that must be communicated to the static timing tool is that only one of the cells in a particular cell column will be written to at any given time. In other words, wl_0 and wl_1 are one-hot signals as discussed previously.

In one known static timing tool, Pathmill, available from Synopsys, Mountain View, Calif., it is necessary to perform the following particulars to force both bl and bl_b to be pre-charge nodes. Instruct the timing tool to ignore the PFET pull-ups for each of the tri-state drivers in TR0 and TR1. It is an option to detach bl and bl_b from being pre-charge nodes during write mode. In that case the PFET pull-ups for TR0 and TR1 would not be ignored and bl and bl_c would show both polarities in FIG. 3. The effective data propagation to nodes bl and bl_b occurs only from the later of either wen or din and din_b, respectively, becoming a logic level one. Again, the pre-charging of nodes bl and bl_b are set to a logic level one via clock node pc.

Timing check s1 assures that the pre-charge node evaluates during the current cycle, i.e. discharges within the necessary time. Timing check s2 assures that the activating data is setup in time, i.e. arrives in time, to avoid falsely discharging node bl. Timing check h3 assures un-activating data holds beyond the edge of the pre-charge element's clock that enables discharging bl so that false evaluation is not possible. Timing check h4 assures that the pre-charge node bl is never in a high impedance state to avoid influence by noise.

Timing checks "set up" and "hold" are standard latch timing checks performed by the static timing tool.

Figure 4:
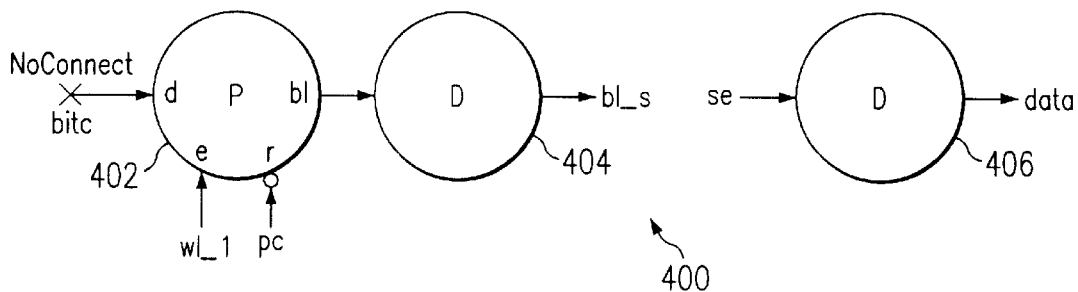
FIG. 4 is a block diagram of a timing representation of a memory cell to use when reading from the memory cell in accordance with the present invention.

FIG. 4 is a block diagram of a timing representation 400 of a memory cell to use when reading from the memory cell in accordance with the present invention. According to the present invention, a memory cell may be represented to a static timing tool as a pre-charge element 402 coupled to a delay element 404 along with a delay element 406 when the timing during a read operation is to be verified.

Figure 5:
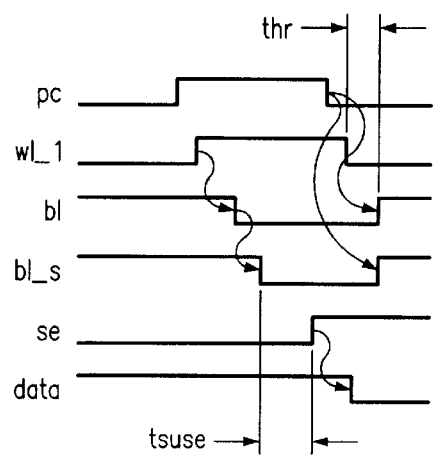
FIG. 5 is a timing diagram depicting timing of multiple signals when reading from a memory cell in accordance with the present invention.

The present invention describes two new timing checks, thr and tsuse (both depicted by FIG. 5). Prior to the static timing tool executing the standard timing checks associated with a pre-charge element coupled to a delay element, during read operations, timing check tsuse must be passed. If timing check tsuse is not passed, the standard timing checks associated with pre-charge and delay elements will not be executed.

FIG. 5 is a timing diagram depicting timing of multiple signals when reading from a memory cell in accordance with the present invention. Two paths need to be considered to assure correct timing. (Of course, all aforementioned constraints for writing the memory must remain intact):

(Path 1) The word line wl__1, etc. is asserted and causes bl and bl__s (or bl__s__b) to drop towards a logic zero because of the storage cell's data polarity. The target value (e.g. 80% Vdd) on bl__s is checked against the activating or falling edge of the read enable clock se. This ensures that se does not turn on prematurely. This check also guarantees that the path corresponding to item 2 below will be accurate as possible and never optimistic; and (Path 2) The sense enable signal se asserts causing bl__s (or bl__s__b) to fall more rapidly causing data (or data__b) to fall. We want to assure a worst-case read time such that given the meeting of the condition in path 1, path 2 assumes only one source of discharge onto node bl__s (or bl__s__b). In other words, the bit line will have no effect on the read time propagation. This is justifiable since the worst case acceptable situation is programmed into the model. The designer must communicate to the static timing tool what minimum amount of bit line discharging (e.g. to 80% Vdd) will enable the read operation to succeed.

FIG. 5 shows the wave forms for paths 1 and 2. For path 1 the data propagates off of the asserting word line (wl__1 rising) to the bit line (bl falling). The setup (read setup time—tsuse) test is to assure data arrives to some designer-determined voltage level (i.e. 80% Vdd) on the bit line prior to the read enable event (se rising). Note that the bit lines had been previously defined as pre-charge nodes in the memory write timing. However, the read pre-charge description is not the same and this presents a subtle static-timing artifact that is novel: a common pre-charge node with two different evaluation paths. The write evaluation path is assumed via the data tri-state drivers (TR0 or TR1) while the read evaluation path occurs via the word line in the cell. Another way of looking at this oddity is that the pass transistor within the memory cell provides the latch mechanism in the write case when data propagates from the bit line into the cell; but when data propagates in the opposite direction in the read situation, then this transistor provides a discharge mechanism onto a pre-charge node (the bit line).

For path 2 the sense enable signal se turns on (high) and accelerates the discharge of bl and bl__s (or bl__s__b) through BUFF__T (BUFF__C) to the output as data (data__b).

Hold time check thr guarantees that bl or bl__b retain their logic values beyond the wl__1 falling event to prevent a false write. This check is universal to all RAM circuit versions and, though pessimistic for some, guarantees proper operation by assuring that the storage nodes are isolated from the pre-charge event.

Figure 6:
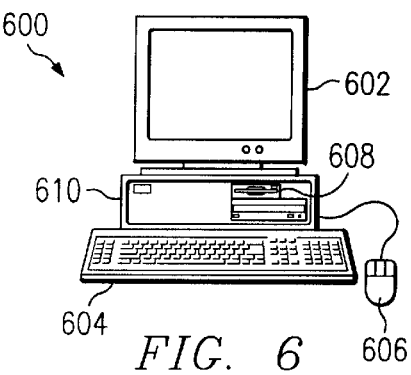
FIG. 6 is a pictorial representation which depicts a data processing system in which the present invention may be implemented in accordance with a preferred embodiment of the present invention.

With reference now to FIG. 6, a pictorial representation of a data processing system used to execute a static timing tool is depicted in accordance with the present invention. A computer 600 is depicted which includes a system unit 602, a video display terminal 604, a keyboard 606, storage devices 608, which may include floppy drives and other types of permanent and removable storage media, and mouse 610. Additional input devices may be included with personal computer 600, such as, for example, a joystick, touchpad, touch screen, trackball, microphone, and the like. Computer 600 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 600 also preferably includes a graphical user interface that may be implemented by means of systems software residing in computer readable media in operation within computer 600.

Figure 7:
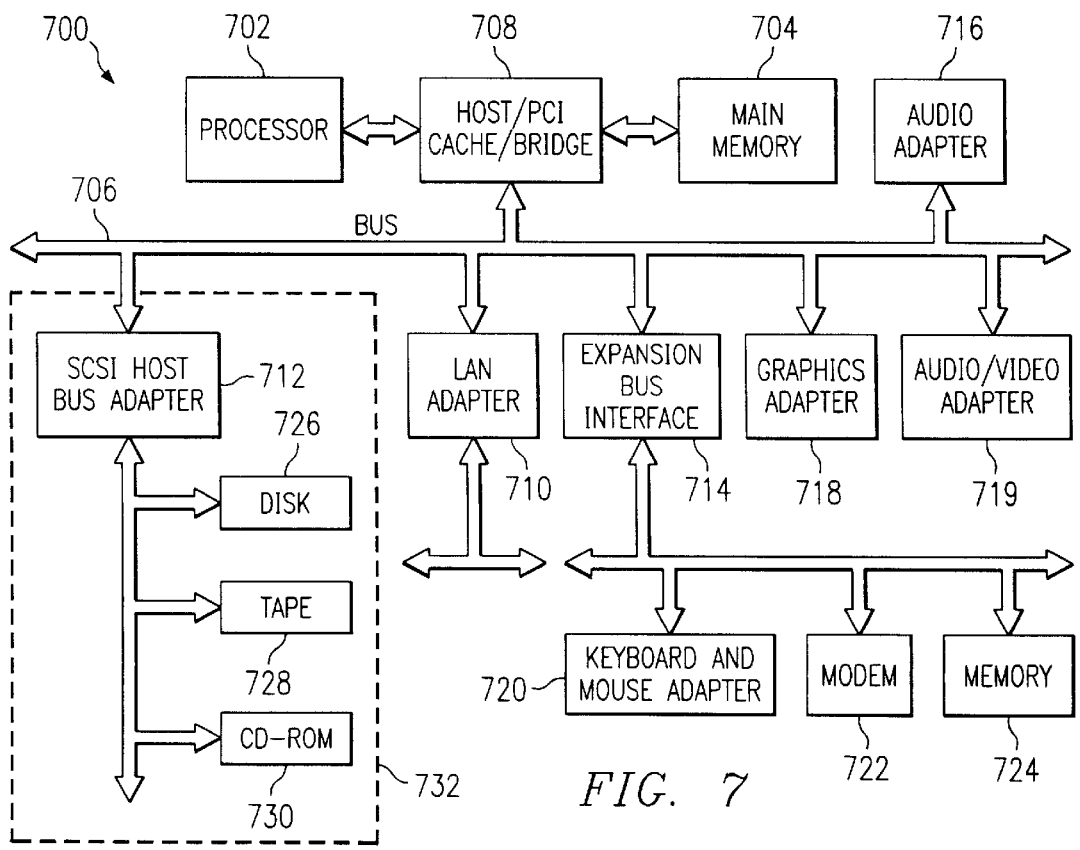
FIG. 7 is a block diagram of a data processing system in which the present invention may be implemented.

With reference now to FIG. 7, a block diagram of a data processing system is shown in which the present invention may be implemented. Data processing system 700 is an example of a computer, such as computer 600 in FIG. 6, in which code or instructions implementing the processes of the present invention may be located. Data processing system 700 employs a peripheral component interconnect (PCI) local bus architecture. Although the depicted example employs a PCI bus, other bus architectures such as Accelerated Graphics Port (AGP) and Industry Standard Architecture (ISA) may be used. Processor 702 and main memory 704 are connected to PCI local bus 706 through PCI bridge 708. PCI bridge 708 also may include an integrated memory controller and cache memory for processor 702. Additional connections to PCI local bus 706 may be made through direct component interconnection or through add-in boards. In the depicted example, local area network (LAN) adapter 710, small computer system interface SCSI host bus adapter 712, and expansion bus interface 714 are connected to PCI local bus 706 by direct component connection. In contrast, audio adapter 716, graphics adapter 718, and audio/video adapter 719 are connected to PCI local bus 606 by add-in boards inserted into expansion slots. Expansion bus interface 714 provides a connection for a keyboard and mouse adapter 720, modem 722, and additional memory 724. SCSI host bus adapter 712 provides a connection for hard disk drive 726, tape drive 728, and CD-ROM drive 730. Typical PCI local bus implementations will support three or four PCI expansion slots or add-in connectors.

An operating system runs on processor 702 and is used to coordinate and provide control of various components within data processing system 700 in FIG. 7. The operating system may be a commercially available operating system such as Windows 2000, which is available from Microsoft Corporation. An object oriented programming system such as Java may run in conjunction with the operating system and provides calls to the operating system from Java programs or applications executing on data processing system 700. "Java" is a trademark of Sun Microsystems, Inc. Instructions for the operating system, the object-oriented programming system, and applications or programs are located on storage devices, such as hard disk drive 726, and may be loaded into main memory 704 for execution by processor 702.

Those of ordinary skill in the art will appreciate that the hardware in FIG. 7 may vary depending on the implementation. Other internal hardware or peripheral devices, such as flash ROM (or equivalent nonvolatile memory) or optical disk drives and the like, may be used in addition to or in place of the hardware depicted in FIG. 7. Also, the processes of the present invention may be applied to a multiprocessor data processing system.

For example, data processing system 700, if optionally configured as a network computer, may not include SCSI host bus adapter 712, hard disk drive 726, tape drive 728, and CD-ROM 730, as noted by dotted line 732 in FIG. 7 denoting optional inclusion. In that case, the computer, to be properly called a client computer, must include some type of network communication interface, such as LAN adapter 710, modem 722, or the like. As another example, data processing system 700 may be a stand-alone system configured to be bootable without relying on some type of network communication interface, whether or not data processing system 700 comprises some type of network communication interface. As a further example, data processing system 700 may be a personal digital assistant (PDA), which is configured with ROM and/or flash ROM to provide non-volatile memory for storing operating system files and/or user-generated data.

The depicted example in FIG. 7 and above-described examples are not meant to imply architectural limitations. For example, data processing system 700 also may be a notebook computer or hand held computer in addition to taking the form of a PDA. Data processing system 700 also may be a kiosk or a Web appliance.

The processes of the present invention are performed by processor 702 using computer implemented instructions, which may be located in a memory such as, for example, main memory 704, memory 724, or in one or more peripheral devices 726–730.

Figure 1:
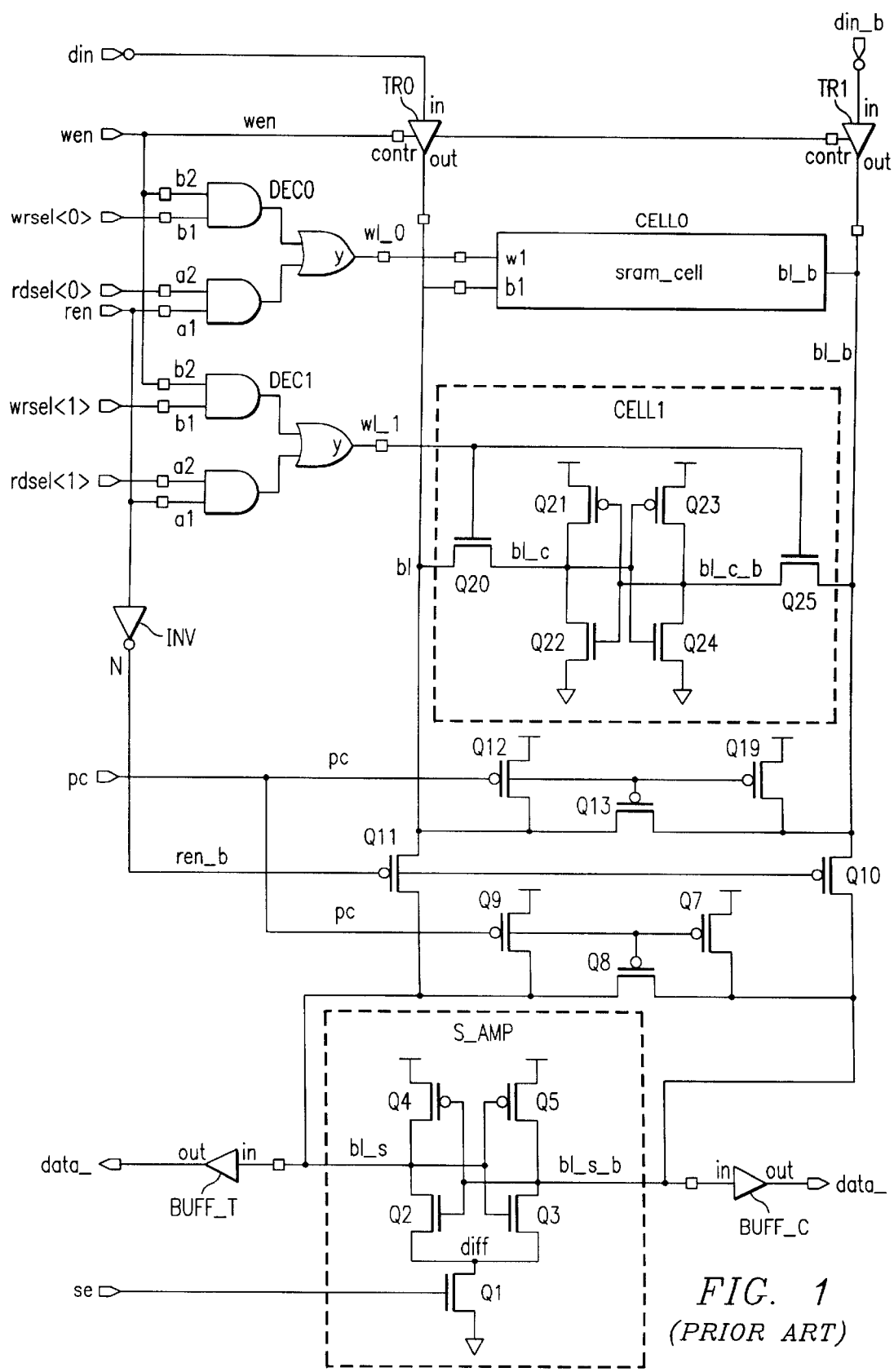
FIG. 1 is a schematic diagram of a two-bit static random access memory (SRAM) circuit in accordance with the prior art.

Although the present invention has been explained with reference to an SRAM circuit, such as depicted by FIG. 1, it should be noted that the read and write addressing scheme as well as the memory cell, the sense amplifier, pre-charge circuits and the tri-state write data buffers attempt to depict typical circuits. Many different configurations and topologies are possible within the context of this invention. The present invention has been described with reference to a two-bit SRAM. However, this invention is applicable for any practical size SRAM.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for automatically performing timing checks on a memory cell, said method comprising the steps of:

providing a static timing tool, said timing tool including a plurality of different standard timing checks; and utilizing said plurality of standard timing checks to verify read timing and write timing in said memory cell;

determining whether a read operation timing in said memory cell is to be verified;

in response to a determination that a read operation timing in said memory cell is to be verified, executing a read setup timing check to determine whether data in said memory cell has reached a predetermined voltage level prior to a read enable event; and only in response to a determination that said memory cell passed said read timing check, utilizing said plurality of standard timing checks to verify timing in said memory cell.

2. The method according to claim 1, wherein the step of utilizing said plurality of standard timing checks to verify timing in said memory cell further comprises the step of utilizing said plurality of standard timing checks to verify timing in said memory cell, said memory cell being included within a static random access memory having dual rail sensing.

3. The method according to claim 1, further comprising the steps of:

associating each one of said plurality of standard timing checks with one of a plurality of different tuning elements;

representing said memory cell to said static timing tool utilizing at least one of said plurality of timing elements; and executing at least one of said plurality of timing checks to verify timing in said memory cell, said at least one of said plurality of timing checks being associated with said at least one of said plurality of timing elements.

4. The method according to claim 1, wherein the step or providing a static timing tool including a plurality of different standard timing checks further comprises the step of providing a static tuning tool including a pre-charge circuit timing check and a latch circuit timing check.

5. The method according to claim 1, further comprising the steps of:

providing said static timing tool including a pre-charge circuit timing check; and utilizing said pre-charge circuit timing check to verify read timing in said memory cell.

6. The method according to claim 5, further comprising the step of representing said memory cell as a pre-charge circuit element.

7. The method according to claim 1, further comprising the steps of:

providing said static timing tool including a pre-charge circuit timing check and a latch circuit timing check; and utilizing said pre-charge circuit timing check and said latch circuit timing check to verify write timing in said memory cell.

8. The method according to claim 7, further comprising the step of representing said memory cell as a pre-charge circuit element coupled to a latch circuit element.

9. The method according to claim 8, further comprising the steps of:

inputting a data signal and a write enable signal into said pre-charge circuit element;

outputting a first signal from said pre-charge circuit element;

receiving said first signal within said latch circuit clement in response to said first signal being outputted from said pre-charge circuit element; and outputting a second signal from said latch circuit element in response to said receipt of said first signal.

10. A data processing system for automatically performing timing checks on a memory cell, said data processing system comprising:

a static timing tool, said static timing tool including a plurality of different standard timing checks;

means for utilizing said plurality of standard timing checks to verify read timing and write timing in said memory cell;

means for determining whether a read operation timing in said memory cells is to be verified;

in response to a determination that a road operation timing said memory cell is to be verified, means executing a read setup timing check to determine whether data in said memory cell has reached a predetermined voltage level prior to a read enable event; and only in response to a determination that said memory cell passed said read timing check, means for utilizing said plurality of standard timing checks to verify timing in said memory cell.

11. The system according to claim 10, wherein said means for utilizing said plurality of standard timing checks to verify timing in said memory cell further comprises means for utilizing said plurality of standard timing checks to verify timing in said memory cell, said memory cell being included within a static random access memory having dual rail sensing.

12. The system according to claim 10, further comprising:

means for associating each one of said plurality of standard timing chocks with one of a plurality of different timing elements;

means for representing said memory cell to said static timing tool utilizing at least one of said plurality of timing elements; and means for executing at least one of said plurality of timing checks to verify timing in said memory cell, said at least one of said plurality of timing checks being associated with said at least one of said plurality of timing elements.

13. The system according to claim 10, wherein said means for providing a static timing tool including a plurality of different standard timing checks further comprises means for providing a static timing tool including a pre-charge circuit timing check and a latch circuit timing check.

14. The system according to claim 10, further comprising:

said static timing tool including a pre-charge circuit timing check; and means for utilizing said pre-charge circuit timing check to verify read timing in said memory cell.

15. The system according to claim 14, further comprising means for representing said memory cell as a pre-charge circuit element.

16. The system according to claim 10, further comprising:

said static timing tool including a pre-charge circuit timing check and a latch circuit timing check; and means for utilizing said pre-charge circuit timing check and said latch circuit timing check to verify write timing in said memory cell.

17. The system according to claim 16, further comprising means for representing said memory cell as a pre-charge circuit clement coupled to a latch circuit element.

18. The system according to claim 17, further comprising:

means for inputting a data signal and a write enable signal into said pre-charge circuit clement;

means for outputting a first signal from said pre-charge circuit element;

means for receiving said first signal within said latch circuit element in response to said first signal being outputted from said pre-charge circuit clement; and means for outputting a second signal from said latch circuit clement in response to said receipt of said first signal.

19. A computer program product in a data processing system for automatically performing timing checks on a memory cell, said computer program product comprising:

instruction means for providing a static timing tool, said timing tool including a plurality of different standard timing checks; and instruction means for utilizing said plurality of standard timing checks to verify read timing and write timing in said memory cell;

instruction means for determination whether a read operation timing in said memory cell is to be verified;

in response to a determination that a read operation timing in said memory cell is to be verified, instruction means for executing a read setup timing check to determine whether data in said memory cell has reached a predetermined voltage level prior to a read enable event; and only in response to a determination that said memory cell passed said read timing check, instruction means for utilizing said plurality of standard timing checks to verify timing in said memory cell.

20. The product according to claim 19, wherein said instruction means for utilizing said plurality of standard timing checks to verify timing in said memory cell further comprises instruction means for utilizing said plurality of standard timing checks to verify timing in said memory cell, said memory cell being included within a static random access memory having dual rail sensing.

21. The product according to claim 19, further comprising:

instruction means for associating each one of said plurality of standard timing checks with one of a plurality of different timing elements;

instruction means for representing said memory cell to said static timing tool utilizing at least one of said plurality of timing elements; and instruction means for executing at least one of said plurality of timing checks to verify timing in said memory cell, said at least one of said plurality of timing checks being associated with said at least one of said plurality of timing elements.

22. The product according to claim 19, wherein said instruction means for providing a static timing tool including a plurality of different standard timing checks further comprises instruction means for providing a static timing tool including a pre-charge circuit timing check and a latch circuit timing check.

23. The product according to claim 19, further comprising:

instruction means for providing said static timing tool including a pre-charge circuit timing check; and instruction means for utilizing said pre-charge circuit timing check to verify read timing in said said memory cell.

24. The product according to claim 23, further comprising instruction means for representing said memory cell as a pre-charge circuit element.

25. The product according to claim 19, further comprising:

instruction means for said static timing tool including a pre-charge circuit timing check and a latch circuit timing check; and instruction means for utilizing said pre-charge circuit timing check and said latch circuit timing check to verify write timing in said memory cell.

26. The product according to claim 25, further comprising instruction means for representing said memory cell as a pre-charge circuit clement coupled to a latch circuit clement.

27. The product according to claim 26, further comprising:

instruction means for inputting a data signal and a write enable signal into said pre-charge circuit element;

instruction means for outputting a first signal from said pre-charge circuit element;

instruction means for receiving said first signal within said latch circuit element in response to said first signal being outputted from said pre-charge circuit element; and instruction means for outputting a second signal from said latch circuit element in response to said receipt of said first signal.

* * * * *

UNITED STATES PATENT AND TRADEMARK OFFICE
CERTIFICATE OF CORRECTION

PATENT NO. : 6,650,592 B2  Page 1 of 1
DATED : November 18, 2003
INVENTOR(S) : Amatangelo et al.

It is certified that error appears in the above-identified patent and that said Letters Patent is hereby corrected as shown below:

Column 8,
Line 27, after "checks;" delete "and".
Line 51, after "different", delete "tuning" and insert -- timing --.
Line 60, after "step", delete "or" and insert -- of --.
Line 63, after "static", delete "tuning" and insert -- timing --.

Column 9,
Line 25, after "circuit", delete "clement" and insert -- element --.
Line 39, after "memory" delete "cells" and insert -- cell --.
Line 40, after "that a" road "and" and insert -- read --.
Line 41, before "said" insert -- in --.
Line 41, after "means" insert -- for --.
Line 58, after "timing", delete "chocks" and insert -- checks --.

Column 10,
Line 25, before "coupled", delete "clement" and insert -- element --.
Lines 28, 33 and 35, after "circuit" delete "clement" and insert -- element --.
Line 42, after "checks;" delete "and".
Line 46, after "means for", delete "determination" and insert -- determining --.

Column 11,
Line 23, after "in said" delete "said".

Column 12,
Line 11, after "pre-charge circuit" delete "clement" and insert -- element --.
Line 11, after "latch circuit" delete "clement" and insert -- element --.

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,650,592 B2
DATED         : November 18, 2003
INVENTOR(S)   : Amatangelo et al.

Page 1 of 1

It is certified that error appears in the above-identified patent and that said Letters Patent is hereby corrected as shown below:

Column 9,
Line 40, after "that a" delete "road" and insert -- read --.

Signed and Sealed this

Fifth Day of October, 2004

JON W. DUDAS
*Director of the United States Patent and Trademark Office*